United States Patent
Noering et al.

(10) Patent No.: US 11,970,079 B2
(45) Date of Patent: Apr. 30, 2024

(54) METHOD FOR DETERMINING AN AGEING CONDITION OF A BATTERY, COMPUTER PROGRAM, MEMORY MEANS, CONTROL DEVICE AND VEHICLE

(71) Applicant: VOLKSWAGEN AKTIENGESELLSCHAFT, Wolfsburg (DE)

(72) Inventors: Fabian Kai-Dietrich Noering, Wolfenbüttel (DE); Martin Wünsch, Braunschweig (DE); Konstantin Jonas, Berlin (DE); Rainer Füssler, Braunschweig (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 747 days.

(21) Appl. No.: 17/046,954

(22) PCT Filed: Apr. 12, 2019

(86) PCT No.: PCT/EP2019/059372
§ 371 (c)(1),
(2) Date: Oct. 12, 2020

(87) PCT Pub. No.: WO2019/197592
PCT Pub. Date: Oct. 17, 2019

(65) Prior Publication Data
US 2021/0046846 A1    Feb. 18, 2021

(30) Foreign Application Priority Data
Apr. 12, 2018   (DE) ................. 10 2018 108 738.1

(51) Int. Cl.
*B60L 58/16* (2019.01)
*G01K 13/00* (2021.01)
(Continued)

(52) U.S. Cl.
CPC .............. *B60L 58/16* (2019.02); *G01K 13/00* (2013.01); *G01R 31/367* (2019.01);
(Continued)

(58) Field of Classification Search
CPC .............. B60L 58/16; B60L 2240/547; B60L 2240/549; G01K 13/00; G01R 31/367;
(Continued)

(56) References Cited

U.S. PATENT DOCUMENTS

| 4,678,998 A | 7/1987 | Muramatsu |
| 6,876,174 B1 * | 4/2005 | Samittier Marti ... G01R 31/389 320/132 |

(Continued)

FOREIGN PATENT DOCUMENTS

| CN | 102859378 A | 1/2013 |
| EP | 1 892 536 A1 | 2/2008 |

(Continued)

OTHER PUBLICATIONS

Office Action for European Patent 19718304.9, dated Jun. 30, 2022.
(Continued)

*Primary Examiner* — Jaime Figueroa
(74) *Attorney, Agent, or Firm* — PEARL COHEN ZEDEK LATZER BARATZ LLP

(57) ABSTRACT

The present invention relates to a method for investigating an ageing condition of a battery (10) which is provided for power supply to an electric motor (20), comprising the steps of: determining at least one graphical progression of at least one operating parameter of the battery (10), checking the at least one graphical progression on at least one sinusoidal curve portion, if at least one sinusoidal curve portion is recognised, extracting the at least one sinusoidal curve portion, calculating an impedance of the battery (10) by means of impedance spectroscopy with reference to the at
(Continued)

least one sinusoidal curve portion, and determining the ageing condition of the battery (10) with reference to the calculated impedance. The invention further relates to a computer program (30), a memory means, a control device (40) and a vehicle (100).

10 Claims, 2 Drawing Sheets

(51) Int. Cl.
| | |
|---|---|
| *G01R 31/367* | (2019.01) |
| *G01R 31/3842* | (2019.01) |
| *G01R 31/389* | (2019.01) |
| *G01R 31/392* | (2019.01) |
| *H01M 10/42* | (2006.01) |
| *H01M 10/48* | (2006.01) |

(52) U.S. Cl.
CPC ....... *G01R 31/3842* (2019.01); *G01R 31/389* (2019.01); *G01R 31/392* (2019.01); *H01M 10/425* (2013.01); *H01M 10/48* (2013.01); *H01M 10/482* (2013.01); *B60L 2240/547* (2013.01); *B60L 2240/549* (2013.01); *H01M 2010/4271* (2013.01); *H01M 2220/20* (2013.01)

(58) Field of Classification Search
CPC .............. G01R 31/3842; G01R 31/389; G01R 31/392; H01M 10/425; H01M 10/48; H01M 2010/4271; H01M 2220/20
USPC ........................................................ 701/1, 22
See application file for complete search history.

(56) References Cited

U.S. PATENT DOCUMENTS

| | | | | |
|---|---|---|---|---|
| 7,253,587 | B2* | 8/2007 | Meissner | G01R 31/367 320/132 |
| 7,554,294 | B2* | 6/2009 | Srinivasan | G01R 31/3842 324/426 |
| 7,675,293 | B2* | 3/2010 | Christophersen | G01R 31/367 324/613 |
| 7,759,901 | B2* | 7/2010 | Hirsch | G01R 31/389 320/132 |
| 8,829,911 | B2* | 9/2014 | Rich | H01M 10/42 320/106 |
| 10,209,314 | B2* | 2/2019 | Garcia | G01R 31/392 |
| 10,684,329 | B2* | 6/2020 | Gajewski | G01R 31/389 |
| 11,196,104 | B2* | 12/2021 | Ballantine | H01M 10/482 |
| 2003/0184307 | A1* | 10/2003 | Kozlowski | H01M 10/48 324/427 |
| 2003/0204328 | A1* | 10/2003 | Tinnemeyer | G01R 31/389 702/30 |
| 2006/0170397 | A1* | 8/2006 | Srinivasan | G01R 31/392 320/132 |
| 2006/0284617 | A1* | 12/2006 | Kozlowski | H01M 10/48 324/426 |
| 2007/0257681 | A1* | 11/2007 | Christophersen | G01R 31/367 324/426 |
| 2008/0048662 | A1* | 2/2008 | Hirsch | G01R 31/389 324/430 |
| 2010/0090650 | A1* | 4/2010 | Yazami | H01M 10/486 324/426 |
| 2011/0060565 | A1* | 3/2011 | Sciarretta | H01M 10/4285 703/2 |
| 2011/0208451 | A1* | 8/2011 | Champlin | G01R 31/3842 702/63 |
| 2011/0208452 | A1 | 8/2011 | Mingant et al. | |
| 2011/0301931 | A1* | 12/2011 | Gering | G01R 31/392 703/13 |
| 2012/0019253 | A1* | 1/2012 | Ziegler | H01M 10/48 324/433 |
| 2012/0078552 | A1* | 3/2012 | Mingant | G01R 31/367 702/63 |
| 2012/0310565 | A1* | 12/2012 | Redey | G01R 31/392 702/63 |
| 2013/0069660 | A1* | 3/2013 | Bernard | G01R 31/367 324/430 |
| 2013/0069661 | A1* | 3/2013 | Rich | H01M 10/42 324/433 |
| 2013/0271089 | A1* | 10/2013 | Yazami | G01R 31/382 320/162 |
| 2014/0188415 | A1* | 7/2014 | Kelly | G01R 31/36 702/63 |
| 2015/0198674 | A1* | 7/2015 | Kroker | G01R 31/392 324/430 |
| 2015/0226812 | A1* | 8/2015 | Gajewski | G01R 31/389 703/18 |
| 2017/0219660 | A1 | 8/2017 | Christensen et al. | |
| 2018/0143257 | A1* | 5/2018 | Garcia | G01R 31/382 |
| 2019/0312317 | A1* | 10/2019 | Ballantine | H01M 10/48 |
| 2022/0317199 | A1* | 10/2022 | Ghantous | H02J 7/00711 |

FOREIGN PATENT DOCUMENTS

| | | |
|---|---|---|
| EP | 3 279 993 A1 | 2/2018 |
| WO | WO 2016/146971 A1 | 9/2016 |

OTHER PUBLICATIONS

Office Action for Chinese Patent Application 201980025382.4, dated Apr. 18, 2023.

Wahyuddin et al. "Direct current load effects on series battery internal resistance" 2017 15$^{th}$ International Conference on Quality in Research (QIR): International Symposium on Electrical and Computer Engineering, IEEE. Jul. 24, 2017, pp. 120-123.

Wang et al. "State Estimation of Lithium Ion Battery Based on Electrochemical Impedance Spectroscopy with On-Board Impedance Measurement System", 2015 IEEE Vehicle Power and Propulsion Conference (VPPC), IEEE. Oct. 19, 2015. pp. 1-5.

International Search Report of PCT Application No. PCT/EP2019/059372, dated Jul. 11, 2019.

Search report for German Patent Application No. 10 2018 108 738.1, dated Mar. 22, 2019.

* cited by examiner

METHOD FOR DETERMINING AN AGEING CONDITION OF A BATTERY, COMPUTER PROGRAM, MEMORY MEANS, CONTROL DEVICE AND VEHICLE

CROSS-REFERENCE TO RELATED APPLICATIONS

This application is a National Phase Application of PCT International Application No. PCT/EP2019/059372, International Filing Date Apr. 12, 2019, claiming priority of German Patent Application No. 10 2018 108 738.1, filed Apr. 12, 2018, which is hereby incorporated by reference.

FIELD OF THE INVENTION

The present invention relates to a method for determining an ageing condition of a battery that is provided to supply energy to an electric motor that serves to power a vehicle. The invention also relates to a computer program for determining an ageing condition of a battery, to a memory means on which a computer program for determining an ageing condition of a battery has been stored, to a control device with a computer program installed on it for determining the ageing condition of a battery, and to a vehicle having such a control device.

BACKGROUND OF THE INVENTION

When it comes to electric vehicles, an important factor consists of having knowledge about the ageing condition (state of health—SOH) of the vehicle battery or traction battery that is provided to supply energy to the electric motor that serves to power the electric vehicle. However, due to complex processes involved in charging and discharging the vehicle battery, the determination of the ageing condition is a demanding task. For the most part, only estimating systems that serve to estimate the ageing condition of the vehicle battery are implemented in today's mass-produced vehicles, but their accuracy is not adequate for many applications.

One way to estimate or determine the ageing condition is by means of impedance spectroscopy. In this context, various sinusoidal frequencies are impinged onto the current of the cells of the vehicle battery. On the basis of their voltage response, conclusions can then be drawn about the impedance of the vehicle battery or of the individual battery cells. This impedance is a quantity which can be used to express the ageing of the battery cell. Up until now, a complex measuring set-up comprising separate, high-grade sensor technology has been employed to carry out such impedance spectroscopy. This gives rise to high costs and can only be employed to a limited extent in mobile systems such as electric vehicles.

For this reason, solutions are currently being sought with which the impedance spectroscopy can be carried without too much effort, even in electric vehicles while they are moving. These solutions are usually based on the development of methods to additionally excite the battery during driving or charging operations.

U.S. Pat. Appln. No. 2011/0208452 A1 puts forward a non-invasive method for determining the electrical impedance of the battery of an electric vehicle. In particular, it proposes using the sensor technology already present in the electric vehicle in order to ascertain the impedance of the vehicle battery or of the cells of the vehicle battery. For this purpose, operating parameters of the vehicle battery such as battery voltage and battery current, are measured and transformed into defined frequency ranges. Subsequently, the impedances of the battery cells in these frequency ranges are calculated and the ageing condition of the vehicle battery is then determined on the basis of the calculated impedances. This procedure, however, does not yet achieve the accuracy needed for determining the ageing condition of the vehicle battery.

SUMMARY OF THE INVENTION

The objective of the present invention is to address the above-mentioned problems, at least in part. In particular, it is the objective of the present invention to create a method, a computer program, a memory means, a control device and a vehicle with such a control device in order to achieve a cost-effective, mobile and/or most accurate possible way to determine the ageing condition of a battery, especially of a vehicle battery.

The above-mentioned objective is achieved by the patent claims. In particular, the above-mentioned objective is achieved by the claimed method, by the claimed computer program, by the claimed memory means, by the claimed control device and by the claimed vehicle. Further advantages of the invention can be gleaned from subordinate claims, from the description and from the figures. In this context, features described in conjunction with the method naturally also apply in conjunction with the computer program according to the invention, with the memory means according to the invention, with the control device according to the invention, with the vehicle according to the invention and vice-versa, so that, when it comes to the disclosure, reference is made or can always be made reciprocally to individual aspects of the invention.

According to a first aspect of the present invention, a method is being put forward for determining an ageing condition of a battery, especially a vehicle battery that is provided to supply energy to an electric motor, especially an electric motor that serves to power a vehicle. The method comprises the following steps:

acquiring at least one graphic curve of at least one operating parameter of the battery, checking the at least one graphic curve for the presence of at least one sinusoidal curve section, if at least one sinusoidal curve section is ascertained, extracting the at least one sinusoidal curve section, calculating the impedance of the battery by means of impedance spectroscopy on the basis of the at least one sinusoidal curve section, and determining the ageing condition of the battery on the basis of the calculated impedance.

Within the scope of the present invention, it has been recognized that systematically filtering the sinusoidal curve sections for the subsequent impedance spectroscopy can easily and considerably improve the results when it comes to determining the ageing condition of the battery, especially of a vehicle battery. As a result, it is possible to dispense with the additional impingement of sinusoidal oscillations by external system components, as had been necessary up until now. In other words, the proposed method can be carried out exclusively using the sensor technology and power electronics already present in the vehicle. Consequently, the method can be carried out in a manner that is very cost-effective, mobile and thus flexible.

When the method according to the invention is being carried out, the sinusoidal curve sections are stored once they have been identified or ascertained. Once a frequency spectrum that is needed for the impedance spectroscopy has been completely acquired, the impedance can be calculated. The calculated impedance can then be converted into the state of health by means of physical ageing models and/or mathematical models.

The at least one sinusoidal curve section can be ascertained by means of a time series analysis. Thus, for instance, relevant sinusoidal curve sections can be identified by ascertaining a similarity between a momentarily measured curve of the current and a reference sinusoidal oscillation. This means that similarity algorithms can be employed to ascertain relevant frequencies or frequency ranges, for example, in the battery current. The at least one graphic curve is preferably checked or analyzed on the at least one sinusoidal section in different frequencies. In other words, it is investigated whether at least one sinusoidal section can be ascertained in different frequency sections of the graphic curve or of the associated operating parameter.

The term battery or vehicle battery as used here can refer to an accumulator such as a lithium-ion battery or a fuel cell. Accordingly, the method can be carried out in battery-powered electric vehicles as well as in fuel cell-powered vehicles.

The vehicle can be configured as a purely electric vehicle or as a hybrid electric vehicle.

The term ageing condition can refer to a state of health of the battery, in other words, to a characteristic variable relating to the functional state of the battery.

The vehicle battery that is provided to supply energy to the electric motor that serves to power the vehicle is the battery by means of which the vehicle can be powered. In other words, the vehicle battery is the source of electro-chemical energy of the vehicle by means of which the electric motor is supplied with current and voltage in order to propel the vehicle. For this reason, the vehicle battery should especially be understood as an appertaining high-voltage battery. Nevertheless, the method according to the invention should not be construed as being limited only to use in such a battery. It is also fundamentally possible for the method to employ any other battery storage device or accumulator.

The term graphic curve refers to a graph or a curve in a coordinate system. Depending on the operating parameters being taken into consideration, the graphic curve can be a current curve and/or a voltage curve of the battery, that is to say, the graphic curve can constitute a current value and/or a voltage value of the battery over time.

The term sinusoidal curve section preferably refers to a curve section or a section in the graphic curve of the at least one operating parameter which, after a falling curve, exhibits a rising curve and subsequently once again a falling curve. The sinusoidal curve section does not have to correspond to a perfect sinusoidal curve. This means that, according to the invention, the at least one graphic curve is checked for the presence of at least one sinusoidal curve section or for the presence of at least one essentially sinusoidal curve section and is subsequently extracted accordingly, if applicable.

The statement that the at least one sinusoidal curve section is extracted from the graphic curve can refer to the fact that the at least one sinusoidal curve section is used for the subsequent calculation of the impedance of the battery or of the battery cells. The at least one sinusoidal curve section can be stored within the scope of the extraction procedure. Once a frequency spectrum that is needed for the impedance spectroscopy has been completely stored and appropriately ascertained, the impedance of the battery can then be calculated as described above.

Determining the ageing condition of the battery on the basis of the calculated impedance can be carried out in that the ageing condition of the battery is determined on the basis of the calculated impedance, for example, by using physical ageing models and/or suitable mathematical models in order to convert the impedance into the ageing condition.

According to another preferred embodiment of the present invention, the at least one operating parameter can be a battery current and/or a battery voltage that is plotted especially over time. Experiments carried out within the scope of the present invention have shown that these operating parameters are well-suited for determining the ageing condition of the battery. According to the invention, in order to determine the ageing condition of the battery, a graphic curve of the battery current over time and/or a graphic curve of the battery voltage over time or of individual voltages over time is/are acquired. In particular, the graphic curves of these operating parameters are acquired. In addition, the state of charge of the battery and/or the temperature of the battery is/are preferably ascertained, especially at least simultaneously in some sections. These operating parameters can be subsequently used for the impedance spectroscopy or to calculate the impedance of the battery. In this case, the graphic curve pertaining to the battery current is appropriately checked for the presence of at least one sinusoidal curve section, and the graphic curve pertaining to the operating voltage is checked for the presence of at least one sinusoidal curve section. Relevant curve sections are then extracted and are each utilized to calculate the impedance of the battery. Moreover, in order to calculate the impedance, preferably the associated state of charge of the battery and the associated temperature of the battery are used, in other words, the state of charge of the battery and the temperature of the battery during the time when the appertaining sinusoidal curve section is being ascertained.

Furthermore, in a method according to the present invention, extracted sinusoidal curve sections can be stored and classified in identical or similar temperature ranges of the battery and/or in identical or similar state-of-charge ranges of the battery, whereby the impedance spectroscopy is carried out on the basis of the classified sinusoidal curve sections. Experiments within the scope of the present invention have shown that the impedance of the battery can be dependent on the temperature and on the state of charge. For this reason, it is advantageous for the impedance spectroscopy to be carried out for similar temperature and/or state-of-charge ranges. Accordingly, a classification in temperature and/or state-of-charge ranges is carried out in a method according to the invention. Therefore, the ageing condition of the battery can be determined very precisely within the scope of this procedure. A preferred temperature range has, for example, a temperature window of approximately 10° C. In this manner, sinusoidal curve sections pertaining to temperatures of the battery that differ from each other by a maximum of approximately 10° C. can be classified in predefined temperature ranges. A preferred state-of-charge range has, for instance, a state-of-charge window of approximately 10%. In this manner, sinusoidal curve sections pertaining to states of charge of the battery that differ from each other by a maximum of approximately 10% can be classified in appropriately predefined state-of-charge ranges.

Moreover, in a method according to the invention, it is possible for the at least one graphic curve of the at least one operating parameter to be carried out online and/or in real time. Therefore, the currents actually measured, for example, while the vehicle is being driven, are analyzed for the presence of sinusoidal curve sections, especially for the presence of sinusoidal curve sections having different frequencies. Thus, within the scope of this procedure, the method can be carried out very easily during mobile use, for example, while the vehicle is being driven. The term real time can refer to the operation of a computation system in which programs that process incoming data are continuously ready to run, namely, in such a way that the results of the processing are available within a prescribed period of time. The data—in the present case data pertaining to the graphic curve—can be acquired on the basis of a randomly timed distribution or else at prescribed points in time, depending on the application case in question. In other words, the graphic curve is acquired continuously here, at least at times continuously, and without major delays.

Moreover, in the case of a method according to the present invention, it is possible for the at least one graphic curve to be filtered through a signal filter in order to reduce signal noise. The filtered or smoothed graphic curve yields a very accurate basis for ascertaining the at least one sinusoidal curve section and consequently also for calculating the impedance as well as for determining the ageing condition of the battery. The filter used here can be a circuit with which the graphic curve is changed as a function of the frequency in the amplitude and in the phase relation in such a way that undesired signal components are attenuated or suppressed in this manner.

According to another variant of the present invention, in one method, the at least one sinusoidal curve section can be extracted to a cloud storage and the impedance spectroscopy and/or the determination of the ageing condition can be executed in the cloud storage or in the cloud.

A computational capacity can be provided outside of the vehicle, something which could not be achieved inside the vehicle, or else only with a disproportionately great effort. The small demand made of the computational capacity in the vehicle means that even less complex components can be installed there. This can translate into less weight in the vehicle and into a reduced need for cooling a computing unit in the vehicle. This is particularly advantageous during mobile use or mobile execution of the method. Aside from impedance spectroscopy, other method steps such as, for example, the storage and/or extraction of the at least one sinusoidal curve, the classification and/or the determination of the ageing condition of the battery based on physical ageing models and/or on mathematical models can all be exported to or carried out in the cloud. Of course, in the case described here, a cloud connection of the vehicle for data exchange purposes has to be ensured. Results in the form of an ageing condition of the battery could then be transmitted back to the vehicle from the cloud or from the cloud storage.

According to another aspect of the present invention, a computer program is being put forward which comprises commands that, when the computer program is being executed by a computer, cause it to carry out the method described in detail above. In this manner, the computer program according to the invention entails the same advantages as those that have been comprehensively described in conjunction with the method according to the invention. The computer program can be implemented in the form of a computer-readable instruction code in any suitable programming language such as, for instance, JAVA or C++. The computer program can be stored on a computer-readable storage medium such as a data disk, a removable drive, a volatile or non-volatile storage unit or a built-in memory/ processor. The instruction code can program a computer or other programmable devices such as a control device in such a way that the desired functions are executed. Moreover, the computer program can be or can have been provided in a network such as, for instance, the internet, from where it can be downloaded by a user as needed. The computer program can be or can have been implemented by means of software or else be in the form of a computer program product by means of one or more special electronic circuits, that is to say, as hardware, or else in any desired hybrid form, that is to say, by means of software components and hardware components.

Moreover, within the scope of the present invention, a memory means is being put forward on which a computer program is stored that is configured and designed to carry out a method as described above. By the same token, a control device is being put forward which has a computer program installed on it as described above and which is configured and designed to carry out a method according to the invention. Consequently, the memory means according to the invention and the control device according to the invention likewise entail the advantages described above.

According to another aspect of the present invention, a vehicle is being put forward which comprises a control device as described above, an electric motor and a battery that is provided to supply energy to the electric motor that serves to power the vehicle. Consequently, the vehicle according to the invention also entails the advantages described above. The vehicle is preferably configured as a purely electric vehicle or else as a hybrid electric vehicle.

Additional measures that improve the invention can be gleaned from the following description pertaining to various embodiments of the invention which are schematically depicted in the figures. All of the features and/or advantages that arise from the claims, from the description or from the figures, including structural details and spatial arrangements, can be essential to the invention either on their own or else in a wide array of combinations.

BRIEF DESCRIPTION OF THE DRAWINGS

The following is shown schematically.

Elements having the same function and mode of operation are provided with the same reference numerals in FIGS. 1 to 3.

DETAILED DESCRIPTION OF THE INVENTION

Figure 1:
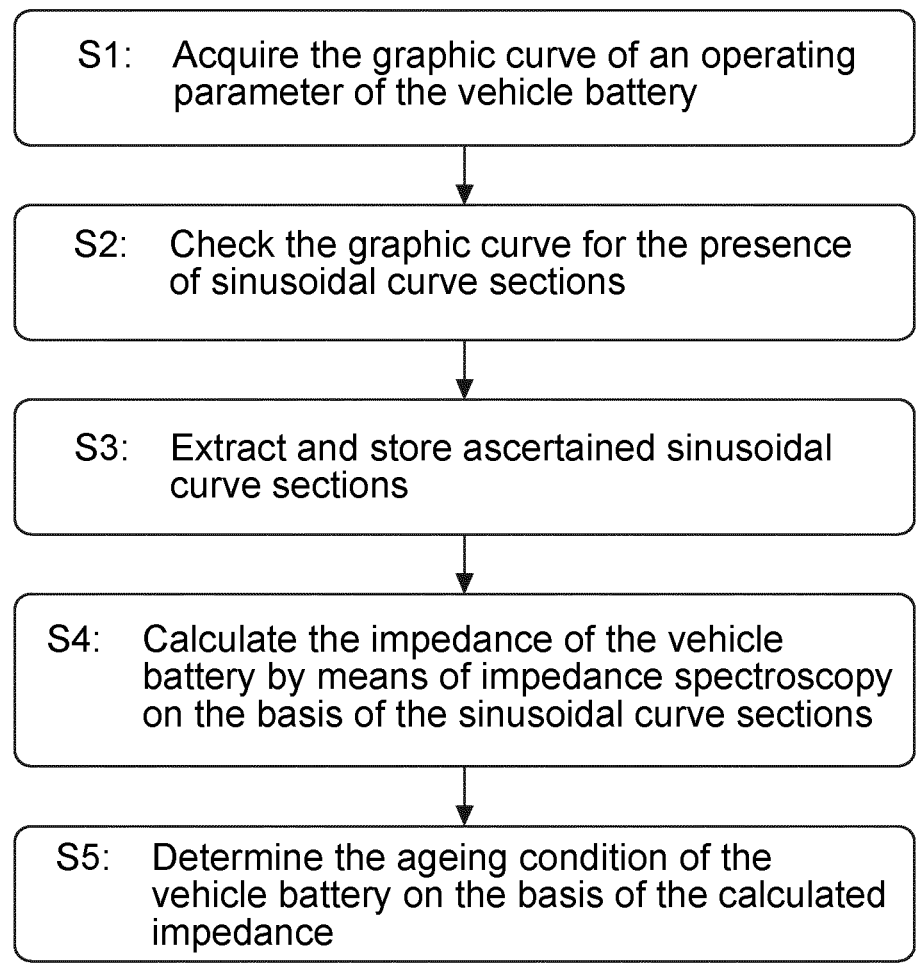
FIG. 1: a flow diagram to elucidate a method according to an embodiment of the present invention.

FIG. 1 shows a flow diagram to elucidate a method according to the invention for purposes of determining an ageing condition of a battery 10 in the form of a high-voltage vehicle battery that is provided to supply energy to an electric motor 20 that serves to power a vehicle 100. According to the method, in a first step S1, to start with, the graphic curve of the current of the battery 10 is acquired. This acquisition is carried out online and in real time. The same is done for the voltage of the battery 10 or of individual cells of the battery 10. In this context, the graphic curves are filtered by a filter in order to reduce signal noise.

During the acquisition of the battery current and the battery voltage or of the associated graphic curves, the temperature and the state of charge (SOC) of the battery for these time periods are detected. In other words, it is ascertained which temperature and which state of charge are present at the point in time of a given battery current or a given battery voltage.

Subsequently, in a second step S2, the graphic curves of the current and of the voltage of the battery 10 are checked or analyzed for the presence of sinusoidal curve sections.

Once sinusoidal curve sections have been detected, in a third step S3, they are extracted and stored in a memory means in the vehicle 100. In a fourth step S4, the impedance of the battery 10 is then calculated by means of impedance spectroscopy on the basis of the sinusoidal curve sections as well as of the associated temperature and associated state of charge. In this context, the extracted sinusoidal curve sections are stored and classified in defined temperature ranges as well as defined state-of-charge ranges of the battery 10, whereby the impedance spectroscopy is carried out on the basis of the classified sinusoidal curve sections.

In a subsequent fifth step S5, the ageing condition of the battery 10 is then determined on the basis of the calculated impedance.

Figure 2:
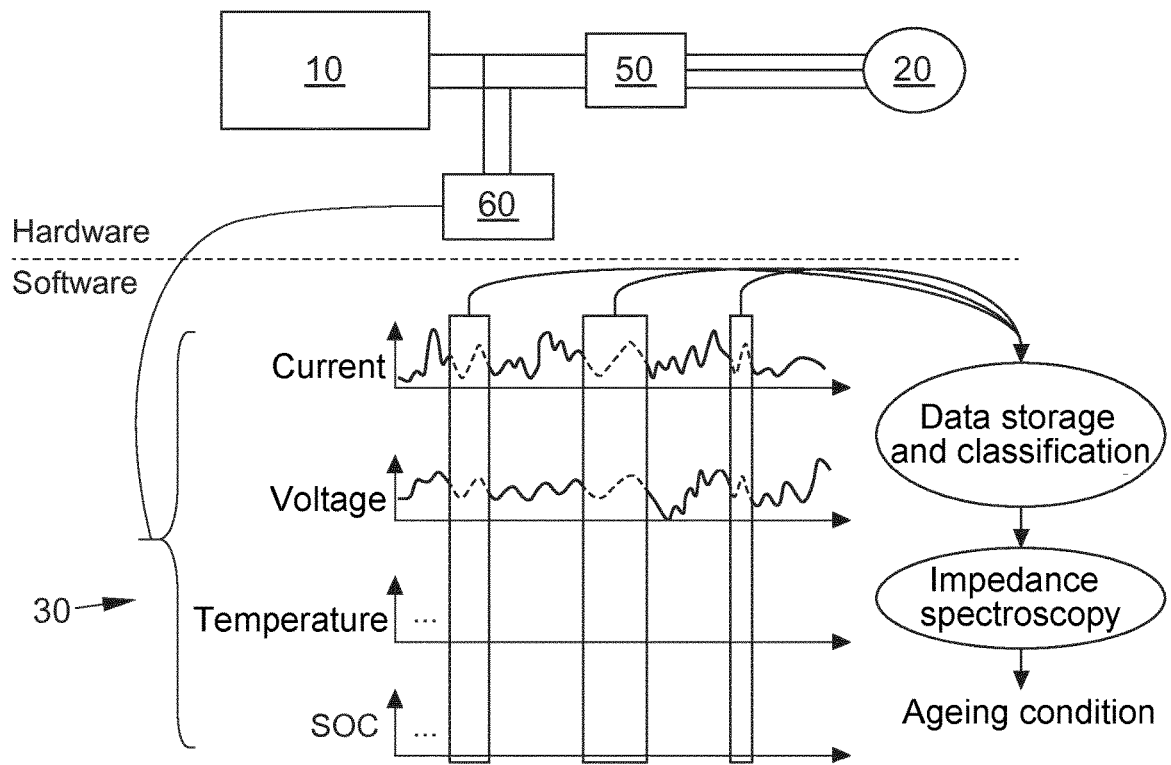
FIG. 2: a block diagram to illustrate the method explained in FIG. 1.

FIG. 2 shows a block diagram to illustrate the method explained above. As depicted in FIG. 2, the electric motor 20 has a signal connection to the power electronics 50. The power electronics 50 have a signal connection to the battery 10 as well as to sensor technology 60 of the vehicle 100. The sensor technology 60 of the vehicle 100 can encompass components such as a voltage meter, a current meter, a thermometer as well as a measuring unit for the state of charge.

FIG. 2 also illustrates a computer program 30 that comprises commands that, when the computer program 10 is being executed by a computer, cause it to carry out the method described above.

Figure 3:
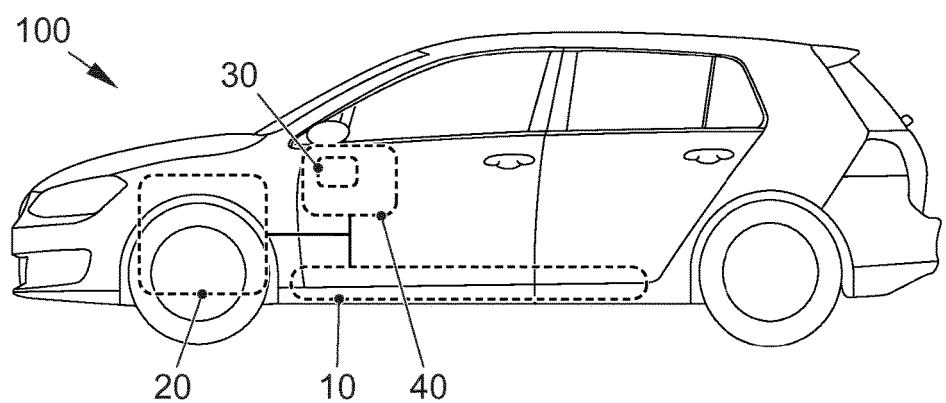
FIG. 3: a vehicle comprising a control device and a computer program installed on it, according to an embodiment of the present invention.

FIG. 3 shows a vehicle 100 comprising a control device 40, an electric motor 20 and a battery 10 that is provided to supply energy to an electric motor 20 that serves to power the vehicle 100. A computer program 30 that is configured and designed to execute the elucidated method is installed on the control device 40.

Aside from the embodiments presented here, the invention encompasses additional configuration principles. In other words, the invention should not be construed as limited to the embodiments explained in conjunction with the figures. For instance, the sinusoidal curve sections can be extracted to a cloud storage and then the data storage, the classification, the impedance spectroscopy as well as the determination of the ageing condition of the battery can all take place in the cloud storage. Subsequently, the determined ageing state is transmitted back to the vehicle 100.

LIST OF REFERENCE NUMERALS 10 battery
20 electric motor
30 computer program
40 control device
50 power electronics
60 sensor instruments
100 vehicle

The invention claimed is:

1. A method for determining an ageing condition of a battery that is provided to supply energy to an electric motor, comprising the following steps:

determining a curve of a current of the battery and/or a voltage of the battery, checking the curve of the current of the battery and/or the voltage of the battery for the presence of sinusoidal curve sections, if sinusoidal curve sections are ascertained, extracting the sinusoidal curve sections with different frequencies, calculating the impedance of the battery by means of impedance spectroscopy, once a frequency spectrum that is needed for impedance spectroscopy has been determined, on the basis of the sinusoidal curve sections, and determining the ageing condition of the battery on the basis of the calculated impedance, wherein it is possible to dispense with the additional impingement of sinusoidal oscillations by external components.

2. The method according to claim 1, wherein the extracted sinusoidal curve sections are stored and, in this process, classified in identical or similar temperature ranges of the battery and/or in identical or similar state-of-charge ranges of the battery, whereby the impedance spectroscopy is carried out on the basis of the classified sinusoidal curve sections.

3. The method according to claim 1, wherein the curve of the current of the battery and/or the voltage of the battery is acquired online and/or in real time.

4. The method according to claim 1, wherein the curve of the current of the battery and/or the voltage of the battery is filtered through a signal filter in order to reduce signal noise.

5. The method according to claim 1, wherein the sinusoidal curve sections are extracted and stored to a cloud storage, and wherein the impedance spectroscopy and/or the determination of the ageing condition is/are executed in the cloud storage.

6. A computer program product for determining an aging condition of a battery that is provided to supply energy to an electric motor, the computer program product comprising a non-transitory computer-readable medium having embodied therewith a program code comprising commands that, when the computer program is being executed by a computer, cause it to carry out the method according to claim 1.

7. A non-transient computer-readable medium containing program containing a program code with instructions configured for causing a computer to carry out the method according to claim 1.

8. A control device, comprising a non-transient computer-readable medium according to claim 7.

9. A vehicle comprising a control device according to claim 8, an electric motor and a battery that is provided to supply energy to the electric motor that serves to power the vehicle.

10. A method for determining an ageing condition of a battery that is provided to supply energy to an electric motor, comprising the following steps:

determining a curve of a current of the battery and/or a voltage of the battery, checking the curve of the current of the battery and/or the voltage of the battery for the presence of sinusoidal curve sections with different frequencies, if sinusoidal curve sections are ascertained, extracting the sinusoidal curve sections with different frequencies, calculating the impedance of the battery by means of impedance spectroscopy, once a frequency spectrum that is needed for impedance spectroscopy has been determined, on the basis of the sinusoidal curve sections, and determining the ageing condition of the battery on the basis of the calculated impedance, wherein it is possible to dispense with the additional impingement of sinusoidal oscillations by external components, wherein the extracted sinusoidal curve sections are stored and, in this process, classified in identical or similar temperature ranges of the battery and/or in identical or similar state-of-charge ranges of the battery, whereby the impedance spectroscopy is carried out on the basis of the classified sinusoidal curve sections.

* * * * *